(12) United States Patent
Liaw

(10) Patent No.: US 9,373,386 B2
(45) Date of Patent: *Jun. 21, 2016

(54) DUAL-PORT SRAM SYSTEMS

(71) Applicant: Taiwan Semiconductor Manufacturing Company, Ltd., Hsin-Chu (TW)

(72) Inventor: Jhon Jhy Liaw, Zhudong Township (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/664,262

(22) Filed: Mar. 20, 2015

(65) Prior Publication Data
US 2015/0194205 A1 Jul. 9, 2015

Related U.S. Application Data

(63) Continuation of application No. 13/789,090, filed on Mar. 7, 2013, now Pat. No. 8,995,176.

(51) Int. Cl.
*G11C 11/00* (2006.01)
*G11C 11/413* (2006.01)
(Continued)

(52) U.S. Cl.
CPC ............ *G11C 11/413* (2013.01); *G11C 11/412* (2013.01); *G11C 29/82* (2013.01); *H01L 27/1104* (2013.01)

(58) Field of Classification Search
CPC .... G11C 29/82; G11C 16/04; G11C 16/0483; G11C 29/76; G11C 29/789; G11C 16/3454; G11C 16/3459; G11C 11/5628; G11C 2211/5621; G11C 16/10; G11C 11/5642; G11C 16/12; G11C 16/3418; G11C 16/26; G11C 16/0416; G11C 16/08; G11C 8/08; G11C 16/30; G11C 16/16; G11C 16/14; G11C 16/3445; G11C 16/344; H01L 27/115; H01L 27/11521
USPC ............ 365/185.09, 185.22, 185.24, 185.17, 365/185.02, 185.05, 185.23, 185.29
See application file for complete search history.

(56) References Cited

U.S. PATENT DOCUMENTS 4,912,675 A 3/1990 Blake et al.
6,693,820 B2 2/2004 Nii et al.
(Continued)

FOREIGN PATENT DOCUMENTS

KR 20130069301 6/2013

OTHER PUBLICATIONS

Allen and Holberg, CMOS Analog Circuit Design, Holt, Rinehart and Winston, Inc., pp. 231-233.

*Primary Examiner* — Fernando Hidalgo
(74) *Attorney, Agent, or Firm* — Slater Matsil, LLP

(57) ABSTRACT

Schematic circuit designs for a dual-port SRAM cell are disclosed, together with various layout schemes for the dual-port SRAM cell. The dual-port SRAM cell comprises: a data latch storage unit comprising a first terminal and a second terminal; a first dummy circuit coupled to the first terminal of the data latch storage unit, the first dummy circuit comprising a first partial dummy transistor and a second partial dummy transistor, wherein the first partial dummy transistor is formed in a first active area of a substrate and the second partial dummy transistor is formed in a second active area of the substrate; and a first gate electrode extending over an edge of the first active area and over an edge of the second active area, wherein the edges of the first active area and the second active area are disposed within a width of the first gate electrode.

20 Claims, 15 Drawing Sheets

(51) Int. Cl.
  *G11C 11/412*   (2006.01)
  *G11C 29/00*    (2006.01)
  *H01L 27/11*        (2006.01)

(56) References Cited

U.S. PATENT DOCUMENTS

| | | | |
|---|---|---|---|
| 6,735,110 B1 | 5/2004 | Lesea | |
| 6,822,894 B1 | 11/2004 | Costello et al. | |
| 8,625,334 B2 | 1/2014 | Liaw | |
| 2002/0100920 A1 | 8/2002 | Yamauchi et al. | |
| 2008/0197419 A1 | 8/2008 | Liaw | |
| 2009/0134472 A1 | 5/2009 | Inaba | |
| 2013/0154027 A1* | 6/2013 | Liaw | H01L 27/1104 257/390 |
| 2014/0133218 A1 | 5/2014 | Liaw | |

* cited by examiner

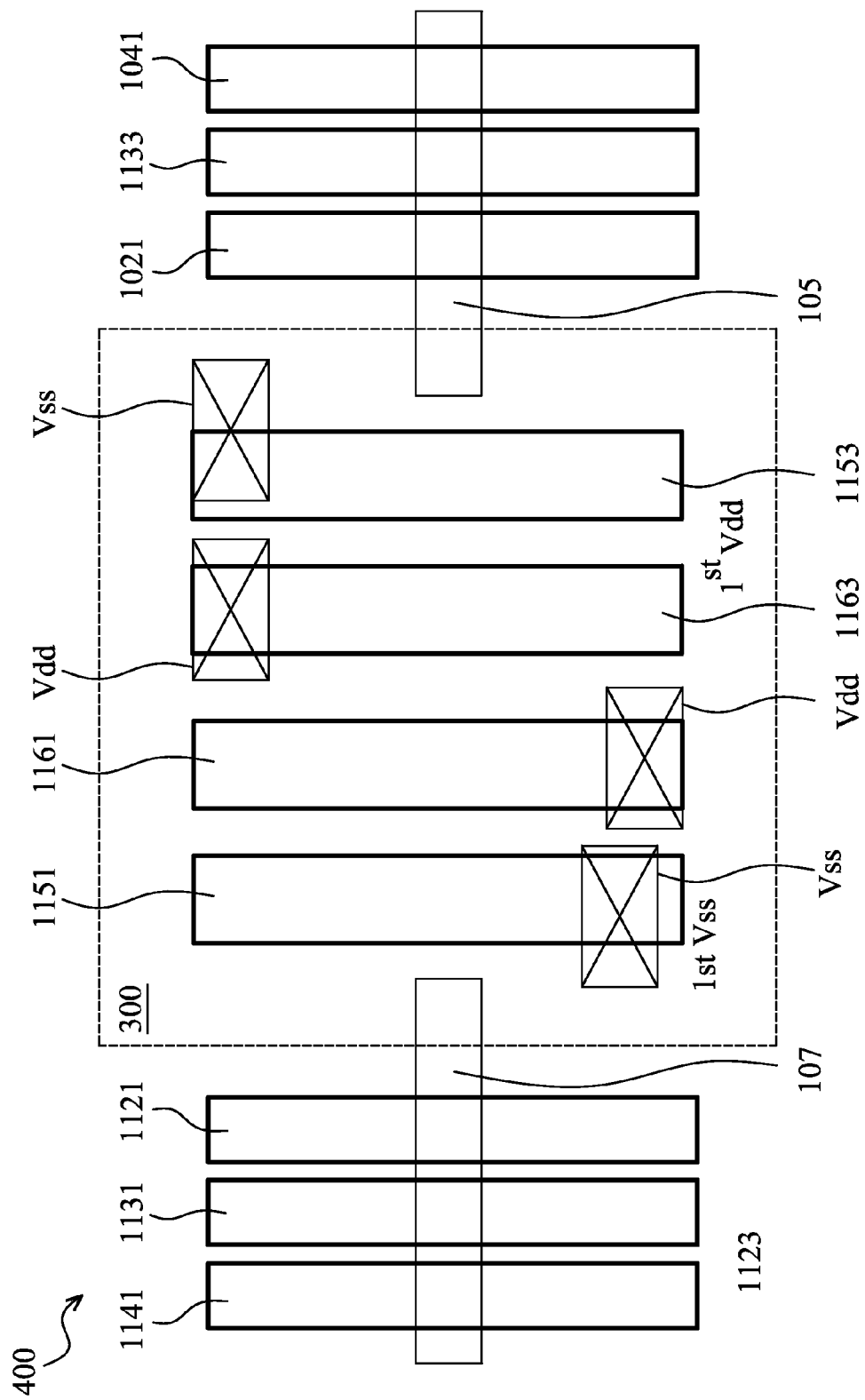

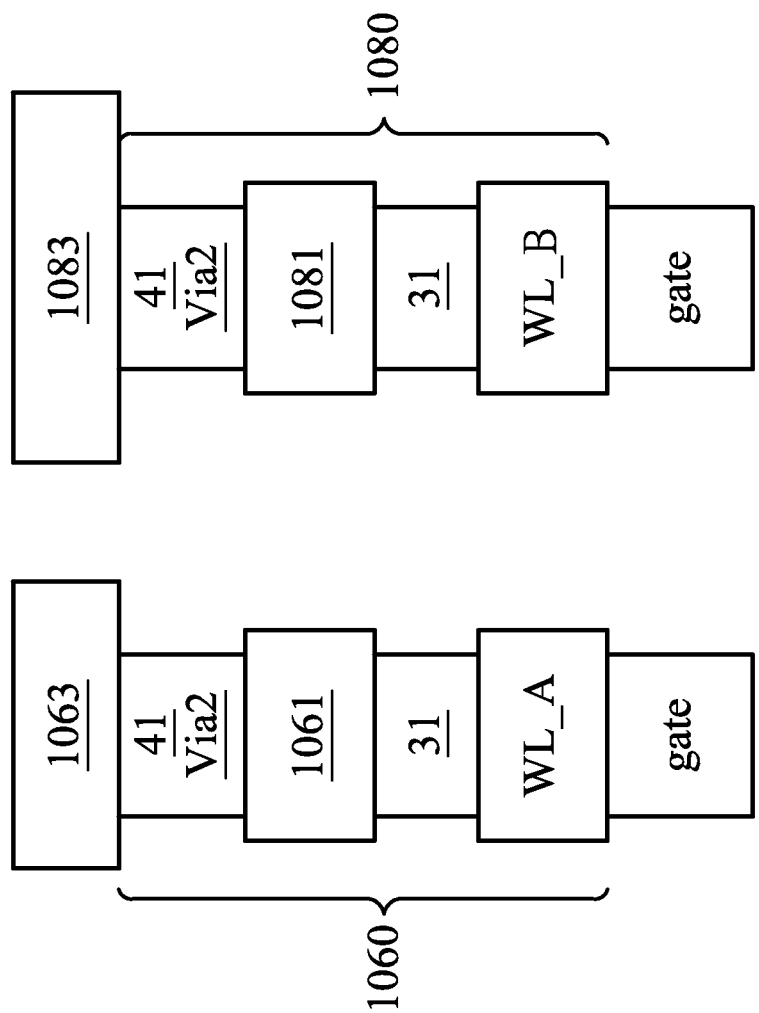

DUAL-PORT SRAM SYSTEMS

PRIORITY CLAIM AND CROSS-REFERENCE

This application is a continuation of U.S. patent application Ser. No. 13/789,090, filed on Mar. 7, 2013, entitled "Dual-port SRAM Systems," which application is hereby incorporated herein by reference.

BACKGROUND

Modern electronic devices such as notebook computers comprise a variety of memories to store information. Memory circuits include two major categories. One is volatile memories; the other is non-volatile memories. Volatile memories include random access memory (RAM), which can be further divided into two sub-categories, static random access memory (SRAM) and dynamic random access memory (DRAM). Both SRAM and DRAM are volatile because they will lose the information they store when they are not powered. On the other hand, non-volatile memories can keep data stored on them without power. Non-volatile memories include a variety of sub-categories, such as read-only-memory (ROM), electrically erasable programmable read-only memory (EEPROM), and flash memory.

SRAM systems, comprising SRAM cells, have the advantageous feature of holding data without a need for refreshing. A SRAM cell may have various numbers of transistors, such as eight transistors (8T) or six transistors (6T). The transistors in a SRAM cell may be metal-oxide-semiconductor field-effect transistors (MOSFET). The MOSFET transistor is a device made of semiconductor materials with four terminals—source, gate, drain, and body (substrate). The SRAM industry has experienced rapid growth due to continuous improvements in the integration density and repeated reductions in minimum feature size. However, the smaller feature size may lead to more leakage current for MOSFET transistors. As the demand for even smaller electronic devices has grown recently, there has grown a need for reducing leakage current of SRAM cells and SRAM systems.

Fin field-effect transistors (FinFET) have smaller device sizes and increased channel widths. Recent advances in FinFET transistor technology have made advanced SRAM cells using FinFET transistors possible. In contrast to the planar MOS transistor, which has a channel formed at the surface of a semiconductor substrate, a FinFET transistor has a three dimensional channel region. The active region of the FinFET transistor, like a fin, is rectangular in shape from a cross section view. The three-dimensional shape of the FinFET transistor channel region allows for an increased gate width without increased silicon area even as the overall scale of the devices is reduced with semiconductor process scaling. To maximize the channel width of a FinFET transistor, the FinFET transistor may include multiple fins, with the ends of the fins connected to a same source and a same drain.

Each bit in an SRAM system is stored on a SRAM cell. SRAM cells are typically arranged as an array having rows and columns. Each row of the SRAM cells is connected to a word line, which determines whether the current SRAM cell is selected or not. Each column of the SRAM cells is connected to a bit line (or a pair of complementary bit lines), which is used for writing a bit into, or reading a bit from, the SRAM cell. A SRAM cell has two stable states which are used to denote 0 and 1, controlled by a word line and bit lines. Although it is not strictly necessary to have two bit lines, both the signal and its complement are typically provided in order to improve noise margins. A SRAM cell may have three different states, sleep where the circuit is idle, reading (R) when the data has been requested, and writing (W) when updating the contents.

In the deep sub-micron technology, embedded SRAM (particularly 8T SRAM) systems become very popular storage units for high speed communication, image processing, and system on chip (SOC) products. SRAM systems need to have high bandwidth, low loading, high speed, and reduced current leakage for the small feature size and deep sub-micron technology.

BRIEF DESCRIPTION OF THE DRAWINGS

For a more complete understanding of the present disclosure, and the advantages thereof, reference is now made to the following descriptions taken in conjunction with the accompanying drawing, in which:

FIGS. 3(a)-3(k) illustrate various top views of a plurality of SRAM cell layouts in accordance with some embodiments.

Corresponding numerals and symbols in the different figures generally refer to corresponding parts unless otherwise indicated. The figures are drawn to clearly illustrate the relevant aspects of the various embodiments and are not necessarily drawn to scale.

DETAILED DESCRIPTION OF ILLUSTRATIVE EMBODIMENTS

Figure 1A:
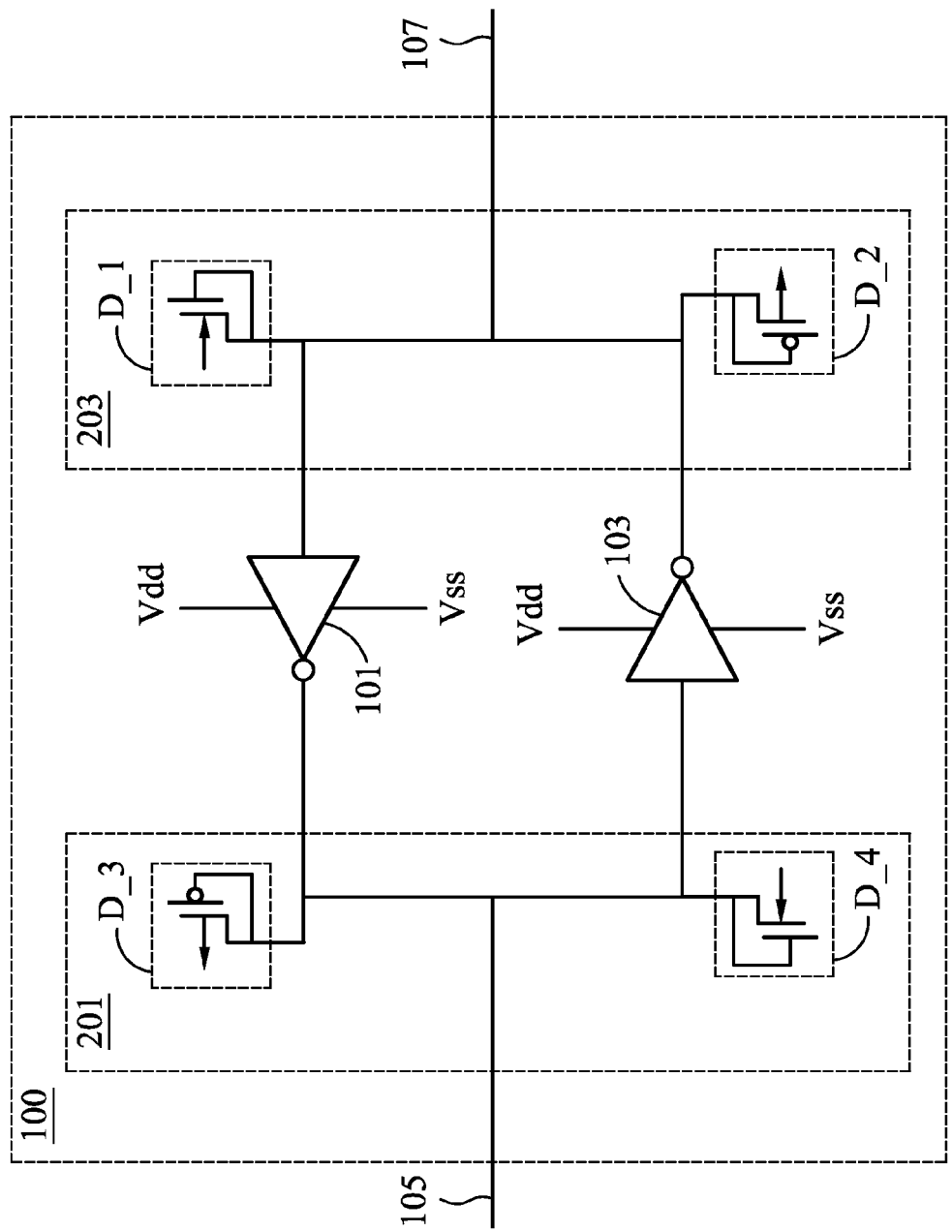
FIGS. 1(a)-1(c) illustrate schematic views of a circuit design for a dual-port SRAM cell in accordance with some embodiments.

The making and forming of the present embodiments are discussed in detail below. It should be appreciated, however, that embodiments of the present disclosure provide many applicable inventive concepts that can be embodied in a wide variety of specific contexts. The specific embodiments discussed are merely illustrative of specific ways to make and use the disclosure, and do not limit the scope of the disclosure.

The making and using of the embodiments are discussed in detail below. Schematic circuit designs for a dual-port SRAM cell are disclosed, together with various layout schemes for the dual-port SRAM cell. The dual-port SRAM cell comprises a storage unit made of a first inverter and a second inverter with a first output and a second output. A first partial dummy transistor and a second partial dummy transistor have dummy drains and dummy gates connected to the first output of the storage unit. A third partial dummy transistor and a fourth partial dummy transistor have dummy drains and dummy gates connected to a second output of the storage unit. The partial dummy transistors can improve the leakage reduction, such as the junction leakage and the gate leakage reduction for the transistors. The dual-port SRAM cell further comprises two word lines, two bit lines, and the complement of the two bit lines, to allow for parallel access to the storage unit which is controlled by four pass gates. A memory operation cycle for the dual-port SRAM cell comprises 1R (read) and 1W (write), 2R (read), or 2W (write), which leads to a higher bandwidth compared to a single port SRAM system.

Various layout schemes for the dual-port SRAM cell are further disclosed. A first gate electrode serves as the gate for a first pull-down transistor and a first pull-up transistor of the first inverter, a dummy gate of the first partial dummy transistor, and a dummy gate of the second partial dummy transistor, while a second electrode serves as the gate for a second pull-down transistor and a second pull-up transistor of the second inverter, a dummy gate of the third partial dummy transistor, and a dummy gate of the fourth partial dummy transistor. Shared gates among the partial dummy transistor and the transistors can save space as well as help the device manufacturing and device matching. A first butt contact connects a first long contact to the first gate electrode, while a second butt contact connects a second long contact to the second gate electrode, so that junction leakage and gate leakage can be reduced. The first long contact further connects to a drain of the second pull-down transistor, a drain of the second pull-up transistor, a drain of a first pass gate transistor, and a drain of a second pass gate transistor. The second long contact further connects to a drain of the first pull-down transistor, a drain of the first pull-up transistor, a drain of a third pass gate transistor, and a drain of a fourth pass gate transistor. To save the device area, the first pass gate transistor and the second pass gate transistor share an active region, while the third pass gate transistor and the fourth pass gate transistor share an active region. The active areas of the transistors and metal lines in the first metal layer are routed in parallel following a first routing direction, perpendicular to the routing direction of the gate electrodes to have a balanced device layout.

Figure 1B:
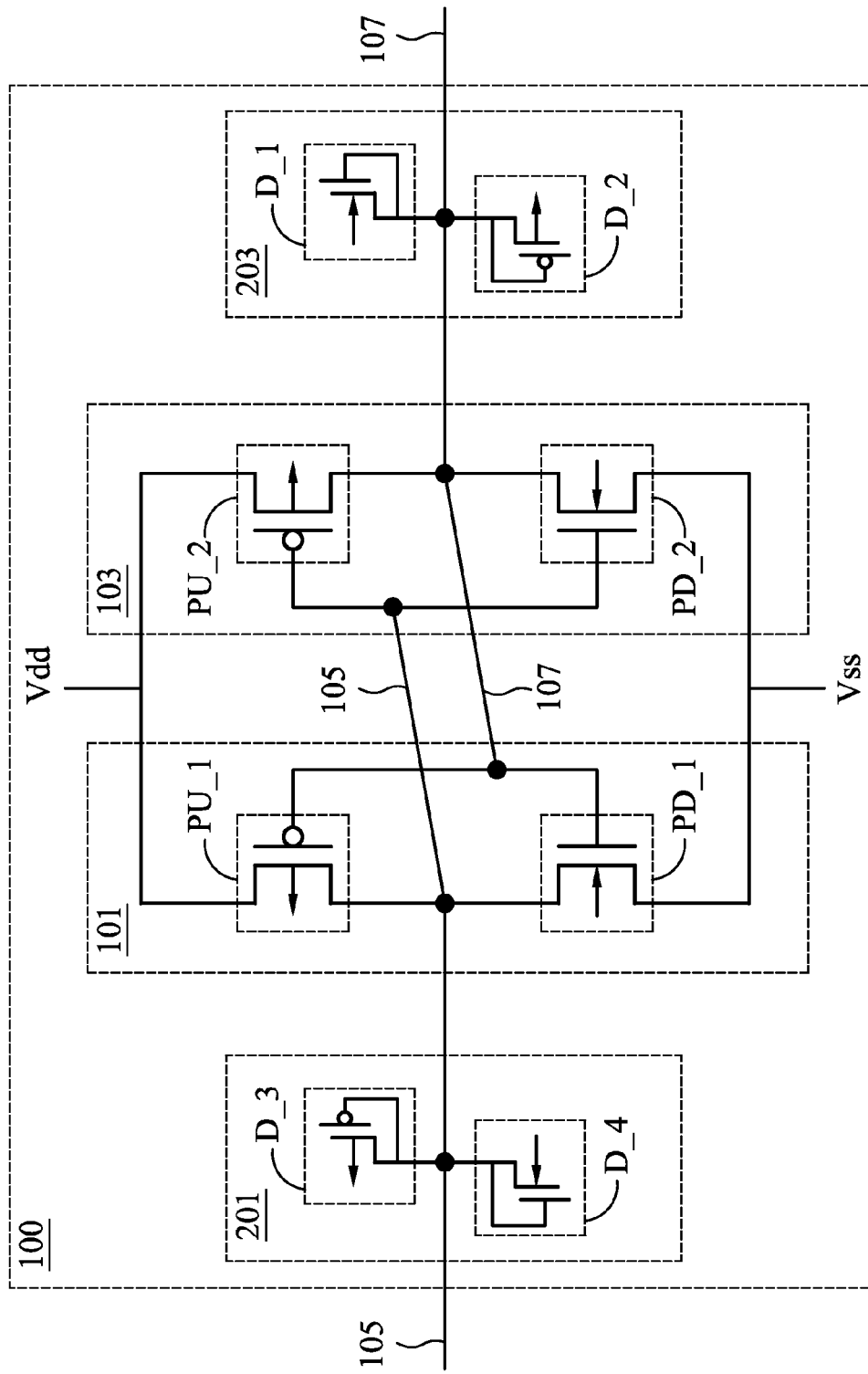
Figure 1C:
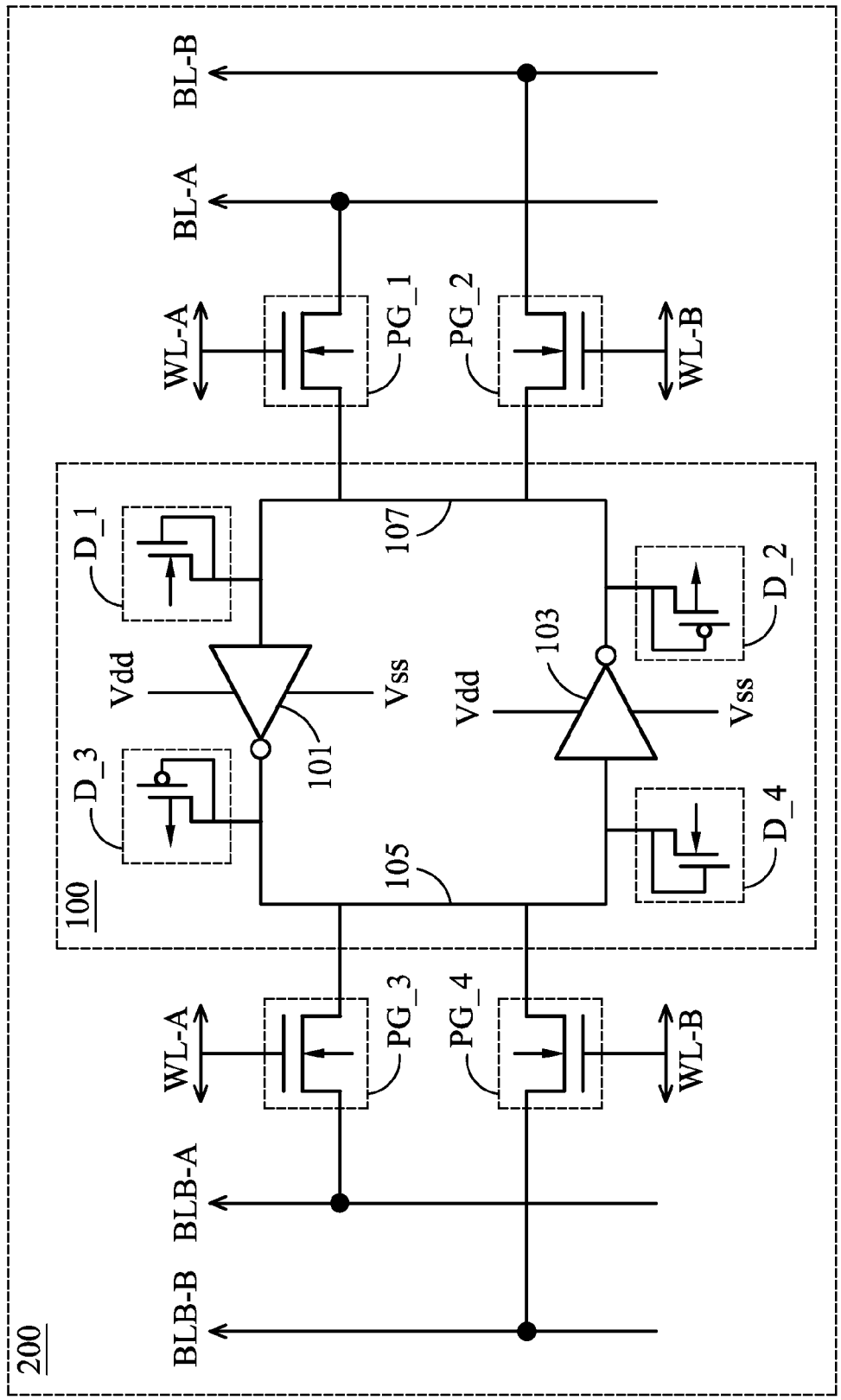

FIGS. 1(a)-1(c) illustrate schematic views of a circuit design for a dual-port SRAM cell in accordance with some embodiments. In FIG. 1(a), a memory storage 100 is illustrated. FIG. 1(b) is an equivalent schematic view of the memory storage 100 of FIG. 1(a), showing more details for invertors 101 and 103. FIG. 1(c) illustrates a SRAM cell 200 comprising the memory storage 100 in FIG. 1(a), with additional pass gates, word lines, and bit lines.

In FIG. 1(a), the memory storage 100 comprises a data latch storage unit with a first inverter 101 and a second inverter 103, in addition to a first dummy transistor D_1, a second dummy transistor D_2, a third dummy transistor D_3, a fourth dummy transistor D_4. The first inverter 101 and the second inverter 103 are connected to a ground signal Vss, and a voltage supply signal Vdd. The first output 105 of the first inverter 101 is the input to the second inverter 103. The second output 107 of the second inverter 103 is the input to the first inverter 101. The first dummy transistor D_1 and the second dummy transistor D_2 form a first dummy circuit 203 connected to the second output 107. The third dummy transistor D_3 and the fourth dummy transistor D_4 form a second dummy circuit 201 connected to the first output 105.

In FIG. 1(b), more details of the memory storage 100 are shown. The first inverter 101 comprises a first pull-down transistor PD_1 and a first pull-up transistor PU_1. The second inverter 103 comprises a second pull-down transistor PD_2 and a second pull-up transistor PU_2. A source of the first pull-down transistor PD_1 and a source of the second pull-down transistor PD_2 are connected the ground signal Vss. A source of the first pull-up transistor PU_1 and a source of the second pull-up transistor PU_2 are connected the voltage supply signal Vdd. A gate of the first pull-down transistor PD_1 and a gate of the first pull-up transistor PU_1 are connected together with a drain of the second pull-down transistor PD_2 and a drain of the second pull-up transistor PU_2, and connected to the second output 107. A gate of the second pull-down transistor PD_2 and a gate of the second pull-up transistor PU_2 are connected together with a drain of the first pull-down transistor PD_1 and a drain of the first pull-up transistor PU_1, and connected to the first output 105.

As used throughout this description, the term signal, such as the ground signal Vss, and the voltage supply signal Vdd, could mean the information bearing voltage/current and/or the physical line carrying the information, depending on the context.

The first pull-down transistor PD_1 and the second pull-down transistor PD_2 are n-type transistors, while the first pull-up transistor PU_1 and the second pull-up transistor PU_2 are p-type transistors. Any of the pull-down transistors and pull-up transistors may be planar MOS transistors, FinFET transistors, or the like. In one embodiment, the first pull-down transistor PD_1 and the second pull-down transistor PD_2 are a FinFET transistor, and the first pull-up transistor PU_1 and the second pull-up transistor PU_2 are a planar MOS transistor.

Furthermore, the first partial dummy transistor D_1 comprises a first dummy drain and a first dummy gate connected to the second output 107. The second partial dummy transistor D_2 comprises a second dummy drain and a second dummy gate connected to the second output 107. The third partial dummy transistor D_3 comprises a third dummy drain and a third dummy gate connected to the first output 105. The fourth partial dummy transistor D_4 comprises a fourth dummy drain and a fourth dummy gate, connected to the first output 105. The first partial dummy transistor D_1 and the second partial dummy transistor D_2 together form the first dummy circuit 203. The third partial dummy transistor D_3 and the fourth partial dummy transistor D_4 together form the second dummy circuit 201. The dummy circuits 201 and 203 can improve the drain and source epitaxial silicon growth uniformity. The dummy circuits 201 and 203 can further improve the leakage reduction, such as the junction leakage and the gate leakage reduction for the transistors, because the dummy circuits 201 and 203 have a common drain and gate design, therefore a same voltage is applied to both the drain and the gate, this can avoid the leakage path between the gate to the drain of the dummy circuits 201 and 203.

FIG. 1(c) illustrates a SRAM cell 200 comprising the memory storage 100 in FIG. 1(a), with additional pass gate transistors, word lines, and bit lines. A first pass gate transistor PG_1 has a drain connected to the second output 107, a gate connected to a first word line WL_A, and a source connected to a first bit line BL_A. A second pass gate transistor PG_2 has a drain connected to the second output 107, a gate connected to a second word line WL_B, and a source connected to a second bit line BL_B. A third pass gate transistor PG_3 has a drain connected to the first output 105, a gate connected to the first word line WL_A, and a source connected to a complement line BLB_A of the first bit line BL_A. A fourth pass gate transistor PG_4 has a drain connected to the first output 105, a gate connected to the second word line WL_B, and a source connected to a complement line BLB_B of the second bit line BL_B. The word lines WL_A and WL_B, and the bit lines BL_A, BL_B, BLB_A, and BLB_B represent the corresponding signals as well as conductive features carrying those signals.

As illustrated in FIG. 1(c), the first pass gate transistor PG_1, the second pass gate transistor PG_2, the third pass gate transistor PG_3, and the fourth pass gate transistor PG_4, are an n-type transistor. However, other types of transistors, such as a p-type transistor may be used in place of n-type transistors. While this description labels terminals as a source or drain, the terminals may be a source or a drain different from the above descriptions. All those various embodiments are included in the scope of the present disclosure.

The illustrative SRAM cell embodiment 200 in FIG. 1(c) may be fabricated by various techniques and technologies. Some additional details of illustrative layout implementations will be shown below. Those implementations are only for illustrative purpose and are not limiting.

Figure 2:
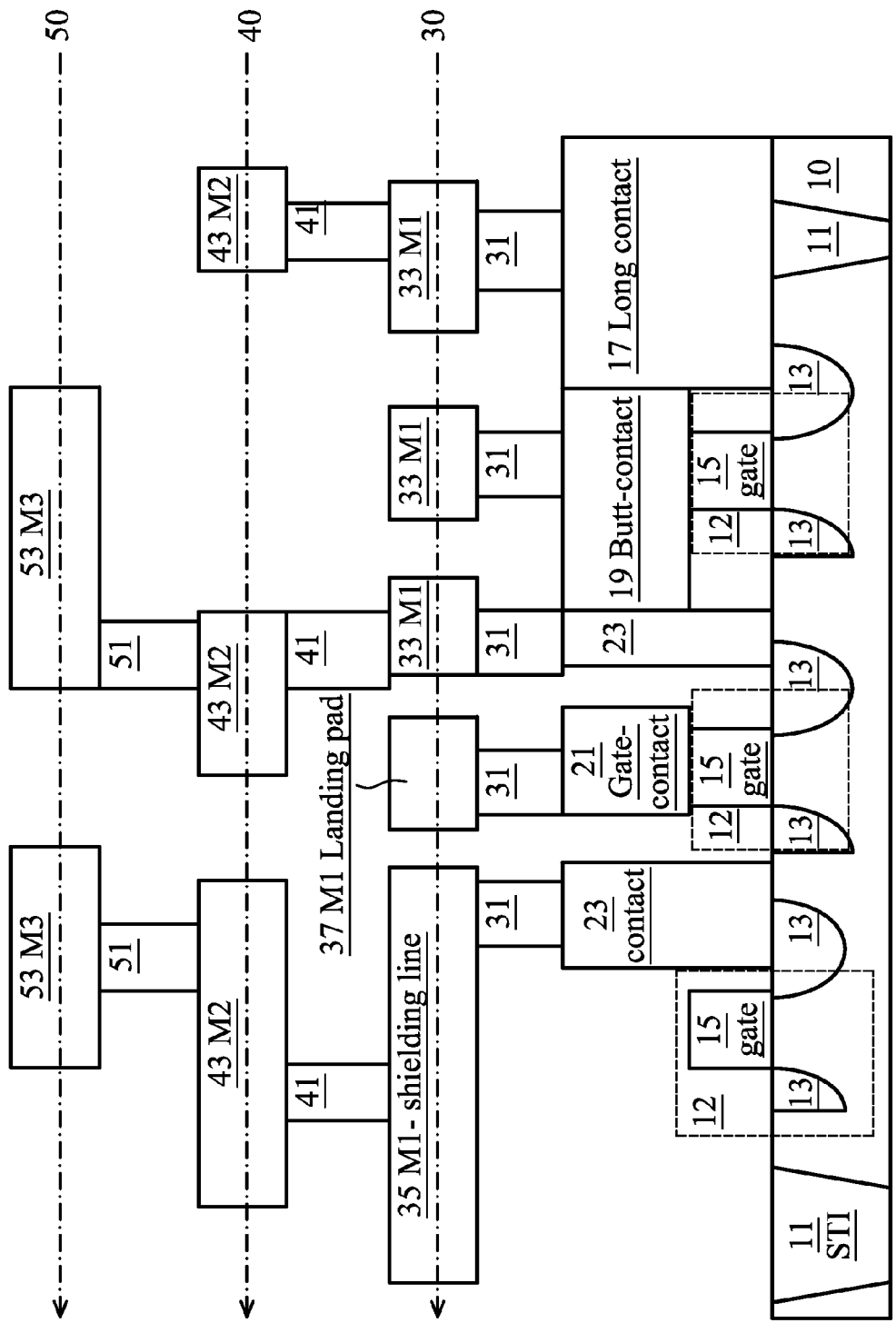
FIG. 2 illustrates various layers of devices, contacts, and metal layers for a SRAM system in accordance with some embodiments.

FIG. 2 illustrates various layers of transistors, contacts, and metal layers for a SRAM system in accordance with some embodiments. These contacts and metal layers are provided here as illustrative examples and may be used in the embodiments for the SRAM cell layouts shown in FIGS. 3(a)-3(k). An SRAM system may comprise a plurality of transistors formed within a substrate, a plurality of contacts formed on the transistors and interconnected by multiple metal layers, which are separated by layers of insulating materials forming inter-dielectric (ILD) layers and/or inter-metal dielectric (IMD) layers. Interconnections between different metal layers are made by vias, which go through insulating layers. Vias allow for communication between interconnects of other metal layers or directly with the semiconductor devices in the substrate. Interconnections between transistor parts such as drain/source regions and gates to metal layers are made by various contacts such as gate contacts, butt contacts, long contacts, or contacts. A SRAM system may comprise three or more metal layers, followed by a final passivation layer. The final passivation layer may be used for protecting the SRAM system from mechanical abrasion during probe and packaging and to provide a barrier to contaminants.

As illustrated in FIG. 2, a substrate 10 is provided, where a plurality of source/drain regions 13 of transistors 12 are formed. A plurality of isolation areas 11, such as shallow trench isolations (STI) or any other isolation structure, may be formed within the substrate 10 as well. A transistor 12 comprises source/drain regions 13 within the substrate 10 and a gate 15 above the substrate 10. There may be a plurality of transistors 12 formed. A first metal layer 30 is above the gates 15. An inter-layer dielectric (ILD) layer, which is not shown, may be formed between the first metal layer 30 and the substrate 10, covering the gates 15. A second metal layer 40 is above the first metal layer 30 separated by an inter-metal dielectric (IMD) layer. Similarly, additional metal layers such as a third metal layer 50 is formed on top of the second metal layer 40. The number of metal layers 30, 40, and 50 is only for illustrative purposes and are not limiting. There could be other number of metal layers that is more or less than the 3 metal layers shown in FIG. 2.

Interconnections between transistor parts such as source/drain regions 13 and gates 15 to metal layers are made by various contacts such as contacts 23, gate contacts 21, butt contacts 19, or long contacts 17. The contact 23 makes a connection between a source/drain region 13 and a first-level via 31. The gate contact 21 makes a connection between a gate 15 and a first-level via 31. The butt contact 19 may be above a gate 15 and connected the gate 15 to other contacts such as the contact 23 or a long contact 17. The long contact 17 may be used to connect to source/drain region 13 and to other gate 15 or butt contact 19. The first-level via 31 may be used to connect the metal lines 33 of the first metal layer 30 to the various contacts under the first metal layer 30. Metal lines in the first metal layer 30 may be called a landing pad 37, a shielding line 35, or a metal line 33, according to its functionality. The second-level vias 41 are used to connect metal lines 33, landing pads 37, or shielding lines 35, of the first metal layer 30 to metal lines 43 of the second metal layer 40. Similarly, the third-level vias 51 are used to connect metal lines 43 of the second metal layer 40 to metal lines 53 of the third metal layer 50.

FIGS. 3(a)-3(k) illustrate various top views of a plurality of SRAM cell layouts in accordance with some embodiments. The layouts in FIGS. 3(a)-3(k) will utilize the metal layers, the various contacts as described above for FIG. 2.

Figure 3A:
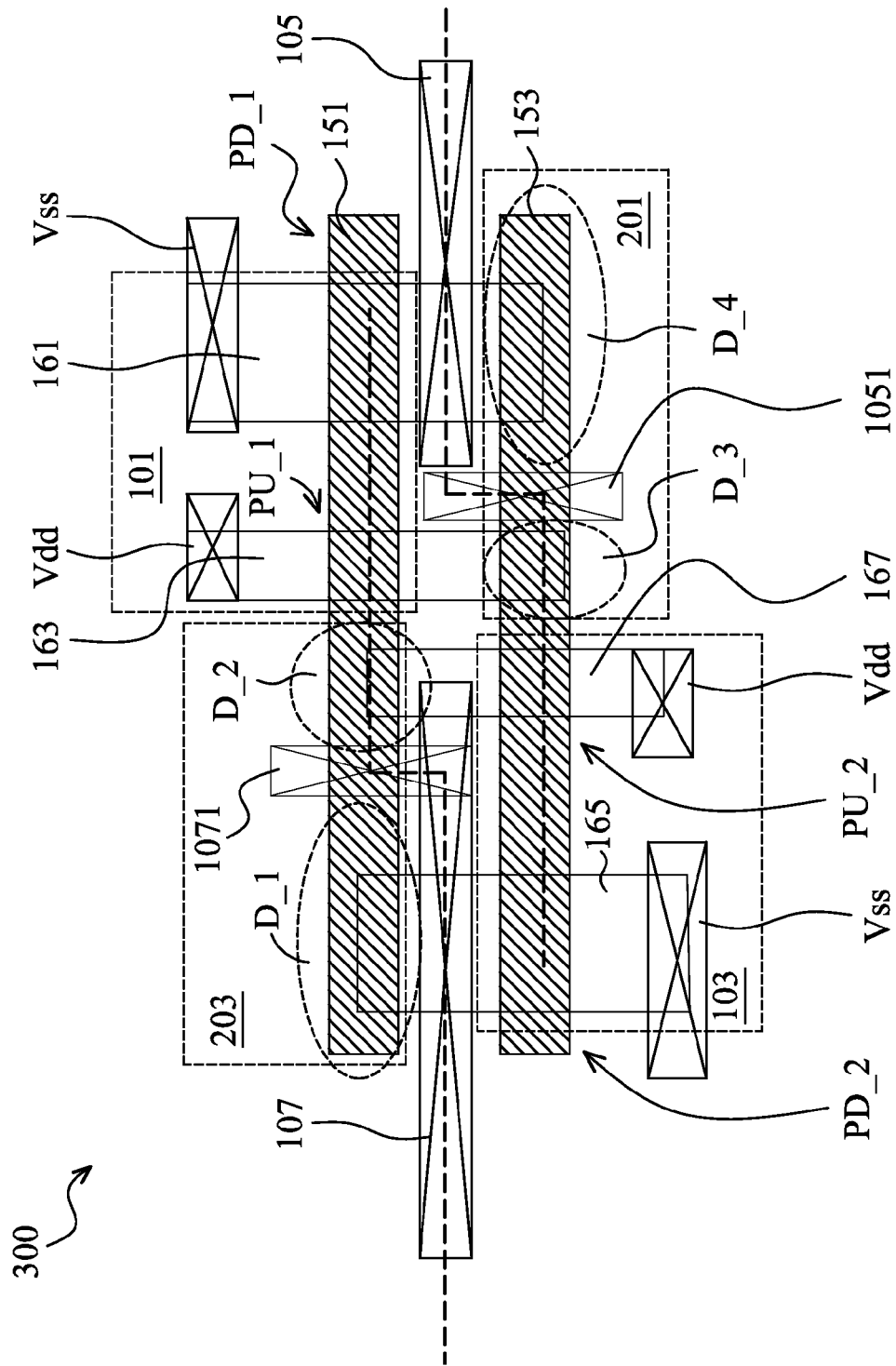
Figure 3B:
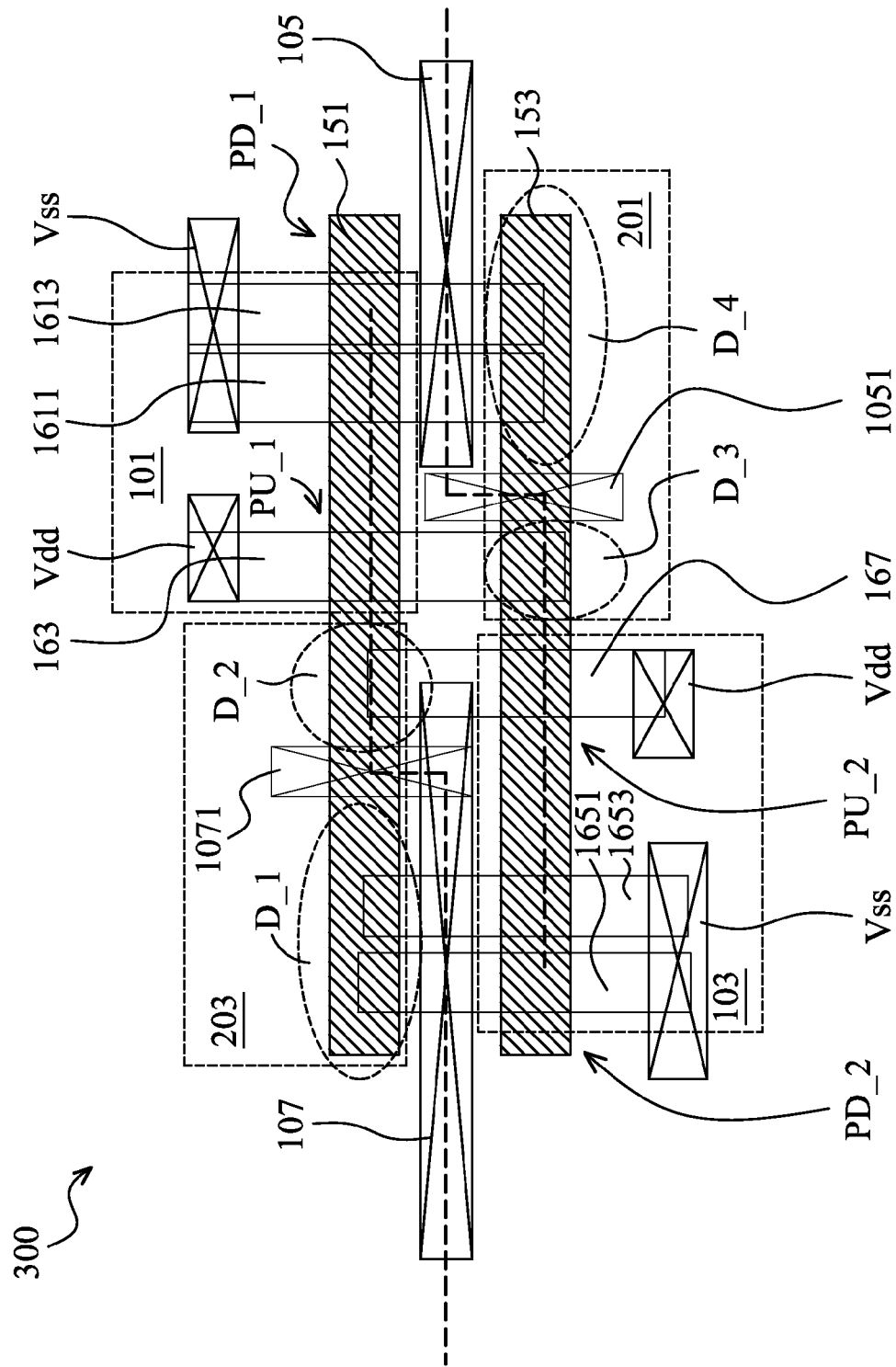
Figure 3C:
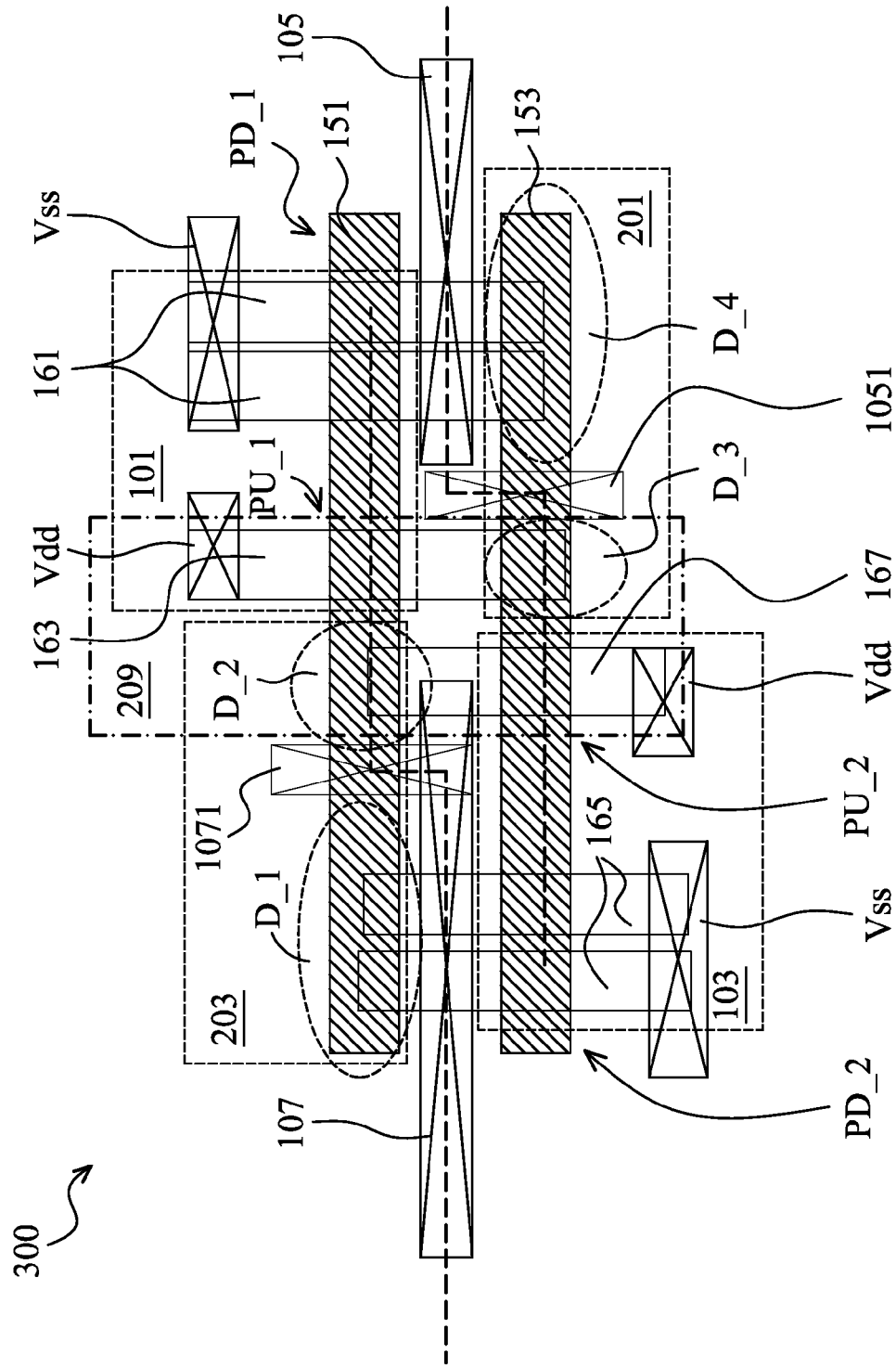

FIG. 3(a) illustrates a layout embodiment 300, which may be a layout for the circuit of the memory storage 100 in FIGS. 1(a) and 1(b). The layout 300 comprises a first gate electrode 151 which acts as a gate for the first pull-down transistor PD_1, a gate for the first pull-up transistor PU_1, a dummy gate for the first partial dummy transistor D_1, and a dummy gate for the second partial dummy transistor D_2. The layout 300 further comprises a second gate electrode 153, which acts as a gate for the second pull-down transistor PD_2, a gate for the second pull-up transistor PU_2, a dummy gate for the third partial dummy transistor D_3, and a dummy gate for the fourth partial dummy transistor D_4. The gate electrode 151 and the gate electrode 153 are routed in parallel along a same direction.

The layout 300 comprises a first active area 161. The first active area 161 comprises a source of the first pull-down transistor PD_1 at a first side of the first gate electrode 151, a drain of the first pull-down transistor PD 1 at a second side of the first gate electrode 151, and a dummy drain for the fourth partial dummy transistor D_4 at a first side of the second gate electrode 153. In this embodiment, the drain of the first pull-down transistor PD_1 and the dummy drain of the fourth partial dummy transistor D_4 share a common doped region of the active area 161 as illustrated in FIG. 3(a). The first active area 161 does not extend beyond the second gate electrode 153 to form a dummy source. Therefore the fourth partial dummy transistor D_4 does not have a source within the substrate to form a channel with the dummy drain of D_4. Instead the fourth partial dummy transistor D_4 has a floating dummy source.

The layout 300 comprises a second active area 163. The second active area 163 comprises a source of the first pull-up transistor PU_1 at the first side of the first gate electrode 151, a drain of the first pull-up transistor PU_1 at the second side of the first gate electrode 151, and a dummy drain for the third partial dummy transistor D_3 at the first side of the second gate electrode 153. In this embodiment, the drain of the first pull-up transistor PU_1 and the dummy drain of the third partial dummy transistor D_3 share a common doped region of the active area 163 as illustrated in FIG. 3(a). The second active area 163 does not extend beyond the second gate electrode 153 to form a dummy source. Therefore the third partial dummy transistor D_3 does not have a source within the substrate to form a channel with the dummy drain of D_3. Instead the third partial dummy transistor D_3 has a floating dummy source.

The layout 300 comprises a third active area 165. The third active area 165 comprises a source of the second pull-down transistor PD_2 at a second side of the second gate electrode 153, a drain of the second pull-down transistor PD_2 at the first side of the second gate electrode 153, and a dummy drain for the first partial dummy transistor D_1 at the second side of the first gate electrode 151. In this embodiment, the drain of the second pull-down transistor PD_2 and the dummy drain of the first partial dummy transistor D_1 share a common doped region of the active area 165 as illustrated in FIG. 3(a). The third active area 165 does not extend beyond the first gate electrode 151 to form a dummy source. Therefore the first partial dummy transistor D_1 does not have a source within the substrate to form a channel with the dummy drain of D_1. Instead the first partial dummy transistor D_1 has a floating dummy source.

The layout 300 comprises a fourth active area 167. The active area 167 comprises a source of the second pull-up transistor PU_2 at the second side of the second gate electrode 153, a drain of the second pull-up transistor PU_2 at the first side of the second gate electrode 153, and a dummy drain of the second partial dummy transistor D_2 at the second side of the first gate electrode 151. In this embodiment, the drain of the second pull-up transistor PU_2 and the dummy drain of the second partial dummy transistor D_2 share a common doped region of the active area 167 as illustrated in FIG. 3(*a*). The fourth active area 167 does not extend beyond the first gate electrode 151 to form a dummy source. Therefore the second partial dummy transistor D_2 does not have a source within the substrate to form a channel with the dummy drain of D_2. Instead the second partial dummy transistor D_2 has a floating dummy source.

The layout 300 further comprises a second long contact 107 connected to the first gate electrode 151 by a second butt-contact 1071, where the first gate electrode 151 is the shared gate of the first pull-down transistor PD_1 and the first pull-up transistor PU_1. The first pull-down transistor PD_1 and the first pull-up transistor PU_1 form the inverter 101 as shown in FIG. 1(*b*), and the second long contact 107 is the input of the invertor 101. The second long contact 107 is further connected to the drain of the second pull-up transistor PU_2, and the drain of the second pull-down transistor PD_2. The second long contact 107 is further connected to the dummy drain of the first partial dummy transistor D_1, and the dummy drain of the second partial dummy transistor D_2.

The layout 300 further comprises a first long contact 105 connected to the second gate electrode 153 by a first butt-contact 1051, where the second gate electrode 153 is the shared gate of the second pull-down transistor PD_2 and the second pull-up transistor PU_2. The second pull-down transistor PD_2 and the second pull-up transistor PU_2 form the inverter 103 as shown in FIG. 1(*b*), and the first long contact 105 is the input of the invertor 103. The first long contact 105 is further connected to the drain of the first pull-up transistor PU_1, and the drain of the first pull-down transistor PD_1. The first long contact 105 is further connected to the dummy drain of the third partial dummy transistor D_3, and the dummy drain of the fourth partial dummy transistor D_4.

The layout 300 further comprises Vss contact connected to the source of the first pull-down transistor PD_1 and the source of the second pull-down transistor PD_2. The layout 300 further comprises Vdd contact connected to the source of the first pull-up transistor PU_1 and the source of the second pull-up transistor PU_2.

FIG. 3(*b*) illustrates another layout embodiment 300, which may be a layout for the circuit of the memory storage 100. Instead of using planar MOS transistors as shown in FIG. 3(*a*), the first pull-down transistor PD_1 illustrated in FIG. 3(*b*) is a first FinFET transistor. For example, the first active area 161 of FIG. 3(*a*), which is the active area of the first pull-down transistor PD_1, is replaced by a first fin-shape line 1611 and a second fin-shape line 1613 in FIG. 3(*b*). Similarly, the third active area 165 of FIG. 3(*a*), which is the active area of the second pull-down transistor PD_2, is replaced by a first fin-shape line 1651 and a second fin-shape line 1653 in FIG. 3(*b*). Other parts of FIG. 3(*b*) may be substantially the same as corresponding parts of FIG. 3(*a*), which have been described above.

The embodiment shown in FIG. 3(*b*) is merely an example. There may be a plurality of fin-shape lines for the first active area and the third active area instead of the two fin-shape lines shown. The number of fin-shape lines is only for illustration, but not limiting. Other transistors such as the first pull-up transistor PU_1 and the second pull-up transistor PU_2 may also be FinFET transistors instead of planar MOS transistors.

FIG. 3(*c*) illustrates another layout embodiment 300, which may be a layout for the circuit of the memory storage 100. As illustrated in FIG. 3(*c*), the first pull-up transistor PU_1 and the second pull-up transistor PU_2 are a p-type transistor formed within an n-type well 209 for the layout 300. The first pull-down transistor PD_1 and the second pull-down transistor PD_2 are n-type transistors. Other parts of FIG. 3(*c*) may be substantially the same as corresponding parts of FIG. 3(*b*), which have been described above.

FIG. 3(*d*) illustrates a layout embodiment 400, which may be a layout for the SRAM cell 200 in FIG. 1(*c*). As illustrated in FIG. 3(*d*), the layout 400 comprises a memory storage layout 300 shown in FIG. 3(*c*). However, any of the memory storage layout 300 shown in FIGS. 3(*a*)-3(*b*) may be used instead, in additional to other alternative memory storage layouts. The layout 400 further comprises a first word line contact WL_A and a second word line contact WL_B, a first bit line contact BL_A, a first complement bit line contact BLB_A, a second bit line contact BL_B, and a second complement bit line contact BLB_B, connected to a plurality of pass gate transistors PG_1, PG_2, PG_3, and PG_4, which are all n-type transistors. These bit line contacts BL_A, BLB_A, BL_B, and BLB_B will be connected to bit lines in the first metal layer, which will be illustrated in FIG. 3(*e*) in more details. The word line contacts WL_A and WL_B are gate contacts and are connected to landing pads in the first metal layer and word lines in the second metal layer, which will be illustrated in FIGS. 3(*i*)-3(*k*) in more details. The access to the memory storage 300 is controlled by the pass gate transistors connected to the bit lines and word lines. More details of the connections of bit lines and the connections to the word lines are illustrated in FIGS. 3(*e*)-3(*k*).

As illustrated in FIG. 3(*d*), the layout 400 comprises a first pass gate transistor PG_1 and a second pass gate transistor PG_2. Both PG_1 and PG_2 are n-type FinFET transistors comprising a plurality of fin-shape lines 162 formed at a same direction as the direction of the active regions of the memory storage 300. The first pass gate transistor PG_1 and the second pass gate transistor PG_2 share a common drain area, which is connected to the second long contact 107. The second long contact 107 is connected to the first gate electrode 151 of the memory storage 300.

A source of the first pass gate transistor PG_1 is connected to the first bit line contact BL_A. A gate of the first pass gate transistor PG_1 is connected to the first word line contact WL_A. The gate of PG_1 transistor is routed in the same direction as the first gate electrode 151 and the second gate electrode 153 of the memory storage 300.

A source of the second pass gate transistor PG_2 is connected to the second bit line contact BL_B. A gate of the second pass gate transistor PG_2 is connected to the second word line contact WL_B. The gate of PG_2 is routed in the same direction as the first gate electrode 151 and the second gate electrode 153 of the memory storage 300.

As illustrated in FIG. 3(*d*), the layout 400 comprises a third pass gate transistor PG_3 and a fourth pass gate transistor PG_4. Both PG_3 and PG_4 are n-type FinFET transistors comprising a plurality of fin-shape lines 164 formed in a same direction as the direction of the active regions of the memory storage 300. The third pass gate transistor PG_3 and the fourth pass gate transistor PG_4 share a common drain area, which is connected to the first long contact 105. The first long contact 105 is connected to the second gate electrode 153 of the memory storage 300.

A source of the third pass gate transistor PG_3 is connected to the first complement bit line contact BLB_A. A gate of the third pass gate transistor PG_3 is connected to the first word line contact WL_A. The gate of the third pass gate transistor PG_3 is routed in the same direction as the first gate electrode 151 and the second gate electrode 153 of the memory storage 300.

A source of the fourth pass gate transistor PG_4 is connected to the second complement bit line contact BLB_B. A gate of the fourth pass gate transistor PG_4 is connected to the second word line contact WL_B. The gate of the fourth pass gate transistor PG_4 is routed in the same direction as the first gate electrode 151 and the second gate electrode 153 of the memory storage 300.

Figure 3D:
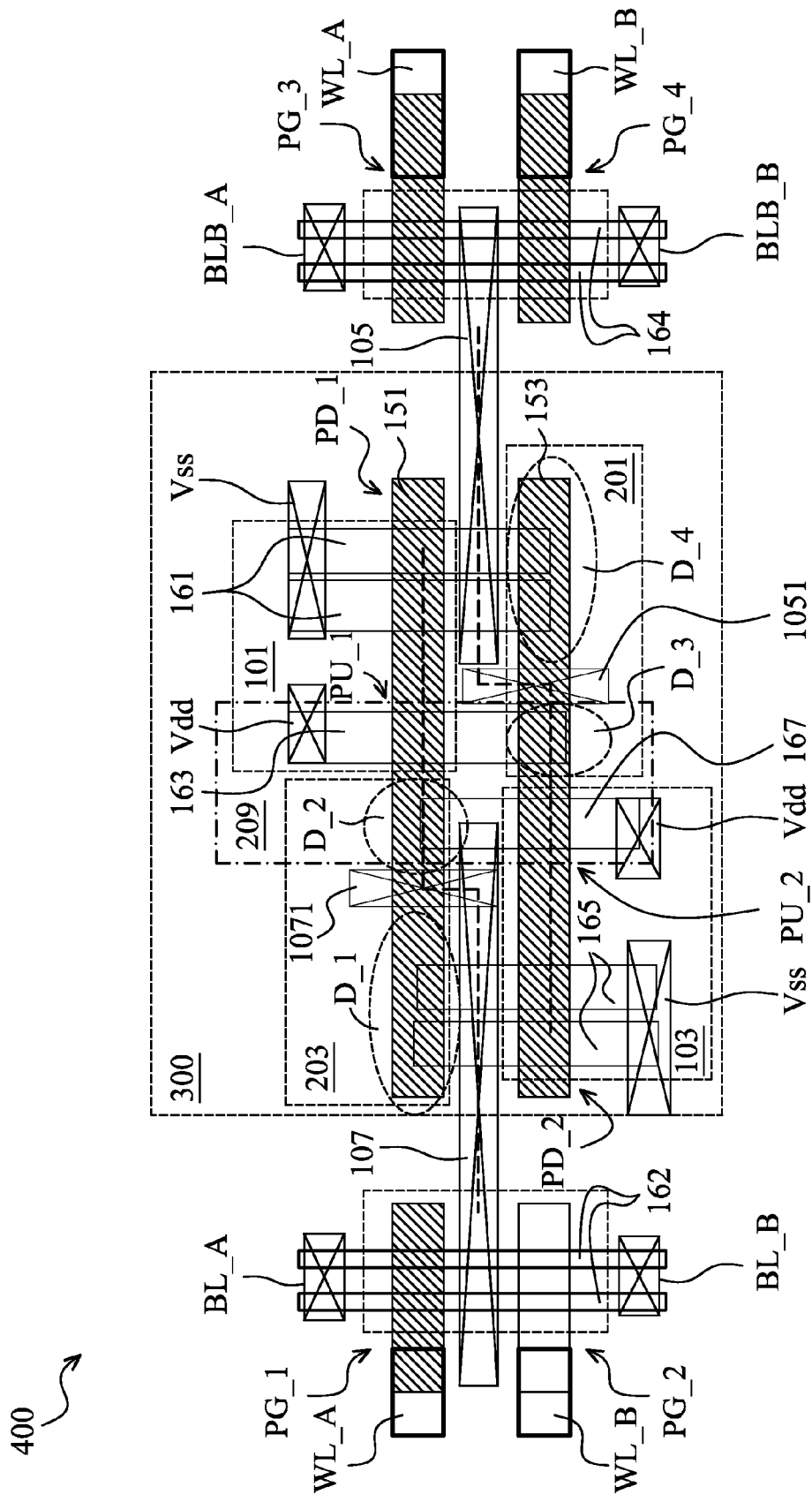

As illustrated in FIG. 3(d), the first pass gate transistor PG_1, the second pass gate transistor PG_2, the third pass gate transistor PG_3, and the fourth pass gate transistor PG_4 are an n-type FinFET transistor, comprising a plurality of fin-shape lines 162 and 164 respectively. Alternatively, MOS planar transistors may be used instead of FinFET transistors for the pass gates. In some other embodiments, the first pass gate transistor PG_1, the second pass gate transistor PG_2, the third pass gate transistor PG_3, and the fourth pass gate transistor PG_4 may be a p-type transistor.

Figure 3E:
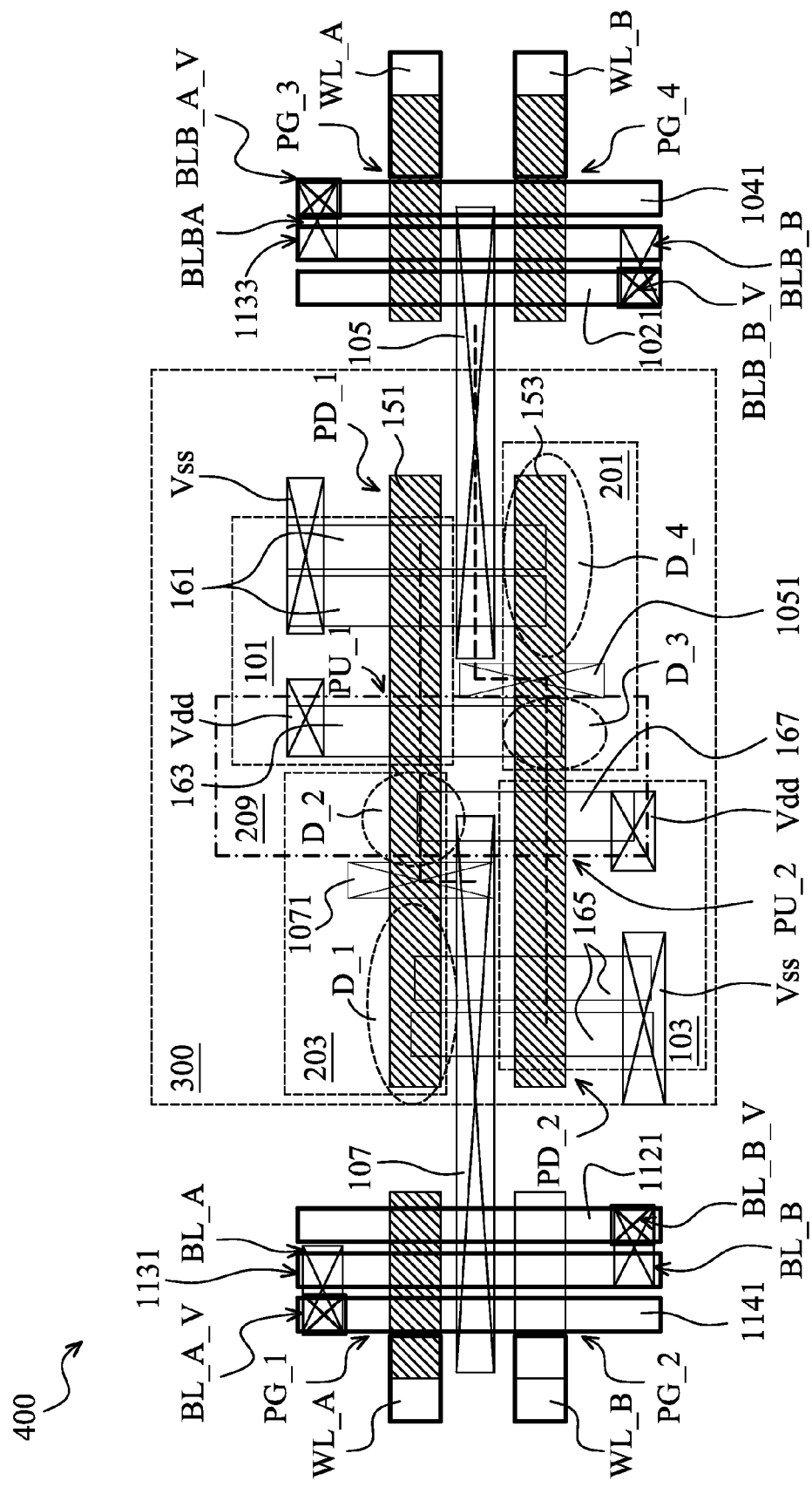
Figure 3F:
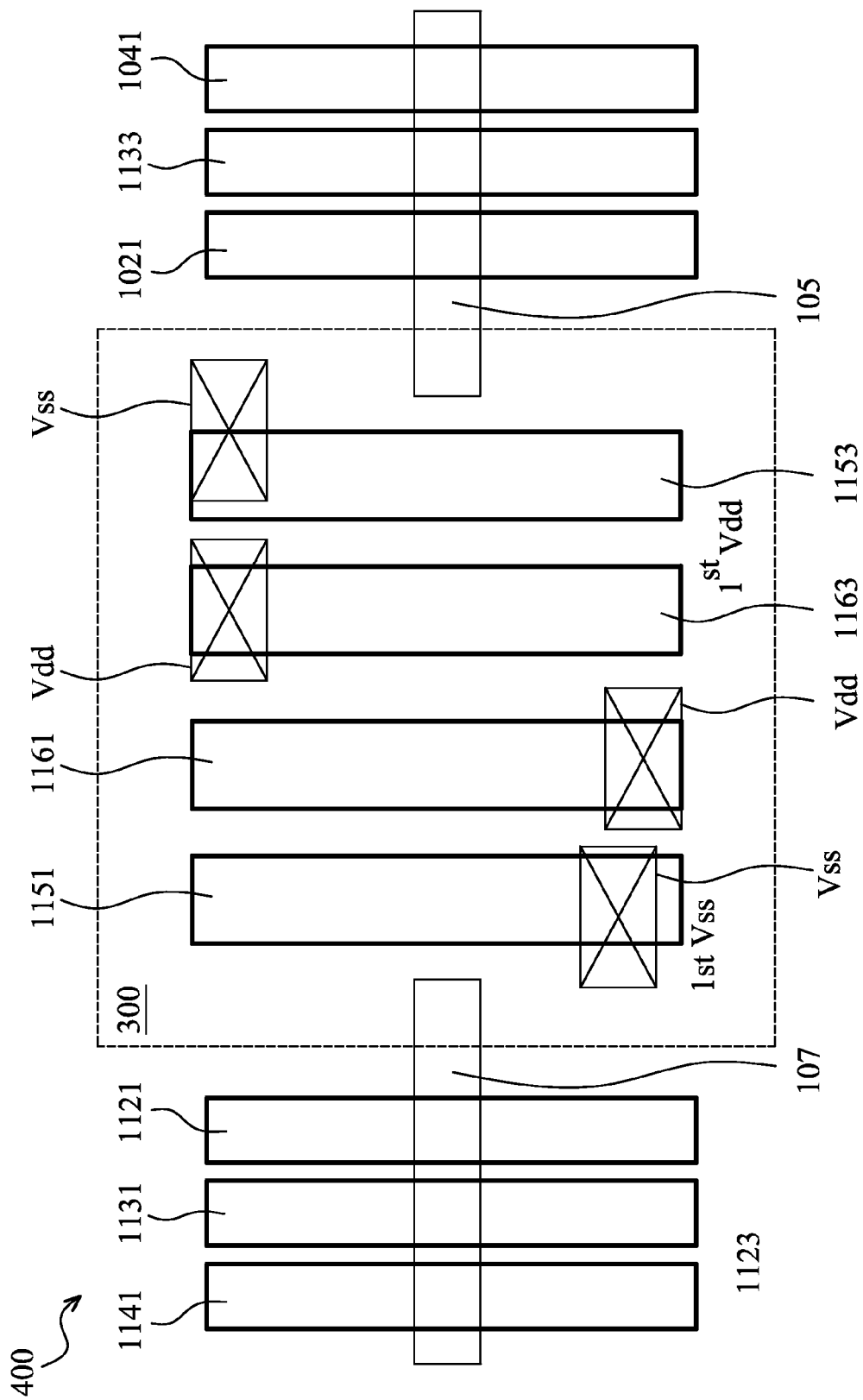

FIGS. 3(e) and 3(f) illustrate the layout 400 illustrated in FIG. 3(d) except the fin-shape lines 162 and 164 from FIG. 3(d) located on the substrate are not shown. Instead, FIGS. 3(e) and 3(f) illustrate the bit line contacts BL_A, BLB_A, BL_B, and BLB_B are connected to bit lines in the first metal layer for the pass gate transistors PG_1, PG_2, PG_3, and PG_4, in addition to a first shielding line 1131 and a second shielding line 1133 at the first metal layer.

As illustrated in FIGS. 3(e) and 3(f), the first metal layer of the layout 400 comprises a first bit line 1141, a first shielding line 1131, a second bit line 1121, a first complement bit line 1041, a second shielding line 1133, and a second complement bit line 1021. The first complement bit line 1041 has the complement signal to the signal of the first bit line 1141. The second complement bit line 1021 has the complement signal to the signal of the second bit line 1121. The first bit line 1141, the first shielding line 1131, the second bit line 1121, the first complement bit line 1041, the second shielding line 1133, and the second complement bit line 1021 are routed in parallel in a direction perpendicular to the direction of the first gate electrode 151 and the second gate electrode 153 of the layout 300. The bit lines 1141, 1121, 1041, and 1021, and the shielding lines 1131 and 1133, are within a first metal layer above the long contacts 107 and 105, and above the devices of the memory storage 300.

The difference between FIG. 3(e) and FIG. 3(f) is the different relative positions among the first complement bit line 1041, the second shielding line 1133, and the second complement bit line 1021. In FIG. 3(e), the relative order starts from the second complement bit line 1021, followed by the second shielding line 1133, and finally the first complement bit line 1041, where the second complement bit line 1021 is closer to the memory storage layout 300. On the other hand, in FIG. 3(f), the relative order starts from the first complement bit line 1041, followed by the second shielding line 1133, and finally the second complement bit line 1021, where the first complement bit line 1041 is closer to the memory storage layout 300.

The first bit line 1141 is connected to the first bit line contact BL_A, by a first-level via BL_A_V. The first bit line contact BL_A is connected to the source of the PG_1, as shown in FIG. 3(d). The second bit line 1121 is connected to the second bit line contact BL_B by a first-level via BL_B_V. The second bit line contact BL_B is connected to the source of the PG_2, as shown in FIG. 3(d). The first complement bit line 1041 is connected to the first complement bit line contact BLB_A, by a first-level via BLB_A_V. The first complement bit line contact BLB_A is connected to the source of the PG_3, as shown in FIG. 3(d). The second complement bit line 1021 is connected to the second complement bit line contact BLB_B by a first-level via BLB_B_V. The second complement bit line contact BLB_B is connected to the source of the PG_4, as shown in FIG. 3(d).

The first shielding line 1131 and the second shielding line 1133 are located in the first metal layer. The first shielding line 1131 is located between the first bit line 1141 and the second bit line 1121 to reduce the noise between the two bit lines and improve the performance of the dual-port access of the SRAM cell 400. The second shielding line 1133 is located between the first complement bit line 1041 and the second complement bit line 1021 to reduce the noise between the two complement bit lines. The shielding lines 1131 and 1133 may be electrically connected to a constant voltage, such as the ground signal or the voltage supply signal.

Figure 3G:
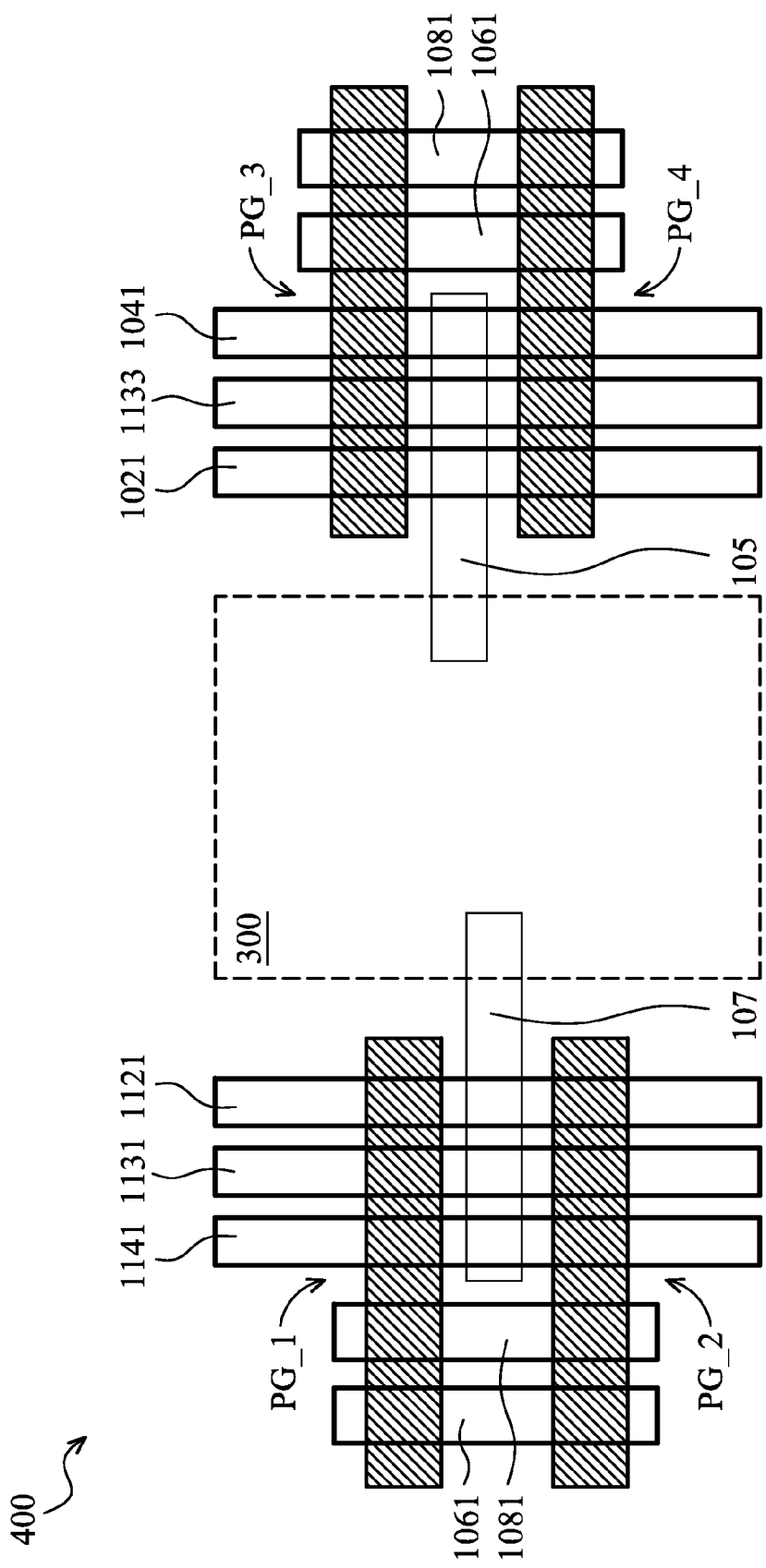

FIG. 3(g) illustrates the layout 400 illustrated in FIG. 3(e), without all details other than those features at metal layer 1. FIG. 3(h) illustrates the layout 400 illustrated in FIG. 3(f), without all details other than those features at metal layer 1. In addition, multiple ground signal lines 1151 and 1153, and multiple voltage supply signal lines 1161 and 1163 are illustrated in the first metal layer of the layout 400. The ground signals 1151 and 1153 may be connected to the Vss contacts. The voltage supply signal lines 1161 and 1163 may be connected to the Vdd contacts. Others devices, contacts, or connections of layers below the first metal layer not shown in FIGS. 3(g) and 3(h) for the layout 400 are the same as the corresponding components shown in FIGS. 3(d), 3(e), and 3(f).

The difference between FIG. 3(g) and FIG. 3(h) is the different relative positions among the first complement bit line 1041, the second shielding line 1133, and the second complement bit line 1021. In FIG. 3(g), the relative order starts from the second complement bit line 1021, followed by the second shielding line 1133, and finally the first complement bit line 1041, where the second complement bit line 1021 is closer to the memory storage layout 300. On the other hand, in FIG. 3(h), the relative order starts from the first complement bit line 1041, followed by the second shielding line 1133, and finally the second complement bit line 1021, where the first complement bit line 1041 is closer to the memory storage layout 300.

Figure 3I:
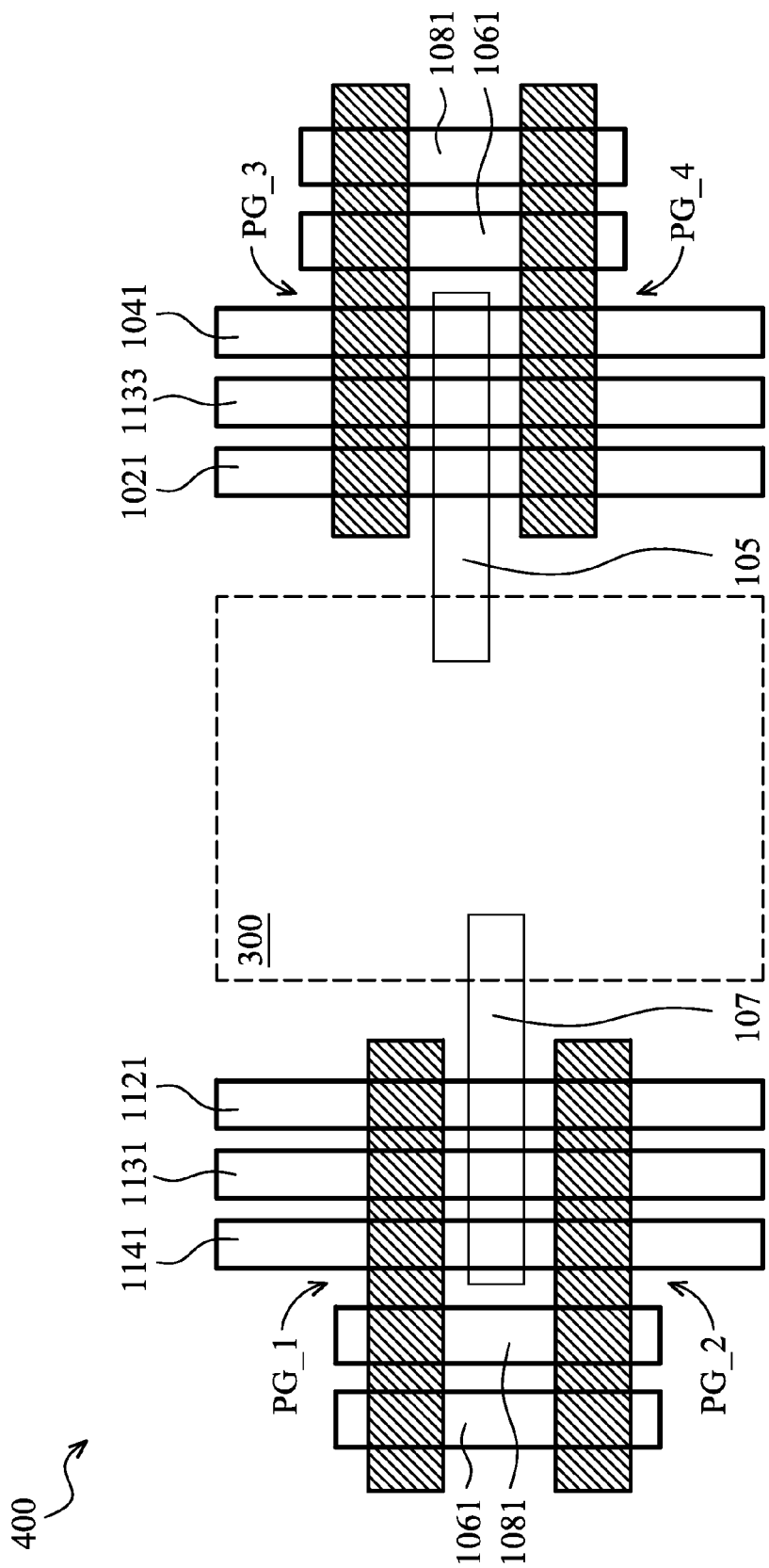
Figure 3K:
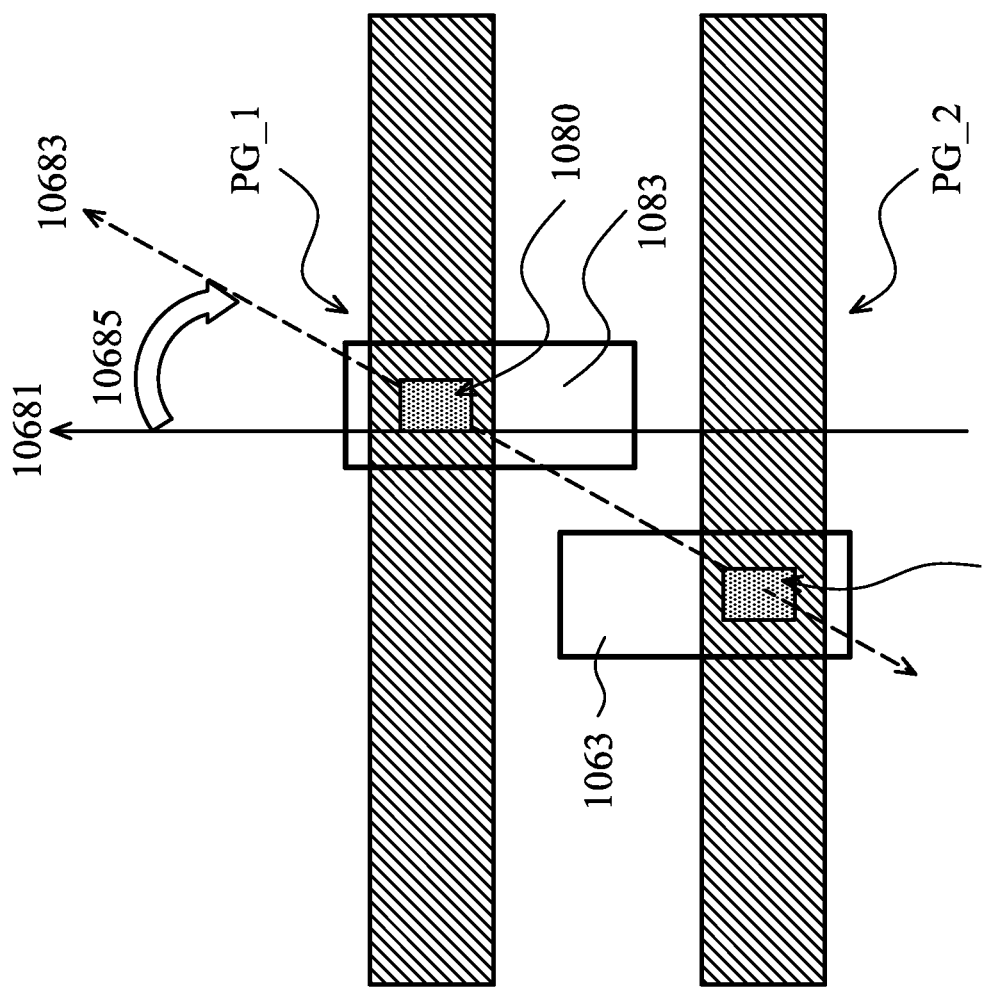

FIGS. 3(i)-3(k) illustrate how the word line contacts WL_A and WL_B of FIG. 3(d) are connected to landing pads at the first metal layer, and the word lines in the second metal layer, for the layout 400 shown in FIGS. 3(d) and 3(e). The word line contacts WL_A and WL_B are gate contacts connected to the gates of the pass gate transistors PG_1, PG_2, PG_3, and PG_4. The layout 400 in FIG. 3(i) illustrates the first metal layer comprising a first landing pad 1061 and a second landing pad 1081, in addition to the bit lines, shielding lines, and the memory storage layout 300 shown in FIG. 3(e). FIG. 3(j) illustrates the word lines 1063 and 1083 located at the second metal layer and connected to the landing pads 1061 and 1081 at the first metal layer by second-level vias 41. The two word lines 1063 and 1083 form a zig-zag style as shown in FIG. 3(k).

As illustrated in FIG. 3(i), a landing pad 1061 and a landing pad 1081 are located in the first metal layer, routed in the same direction as the bit lines 1141, 1121, 1041, and 1021. The landing pad 1061 is connected to the gate of PG_1 or the gate of PG_3 by the gate contact WL_A, and a first-level via 31, as shown in FIG. 3(j). The landing pad 1081 is connected to the gate PG_2 or the gate of PG_4 by the gate contact WL_B, and a first-level via 31, as shown in FIG. 3(j).

As illustrated in FIG. 3(j), the first word line 1063 is a metal line in the second metal layer. The first word line 1063 is routed at the same direction as the first landing pad 1061. The first word line 1063 connects to the landing pad 1061 by a second-level via 41. Therefore the gate of the first pass gate PG_1 is connected to the first word line 1063 at the second metal layer by a first contact group 1060, comprising the gate contact WL_A on the gate of the first pass gate PG_1, a first-level via 31 on the gate contact WL_A, a landing pad 1061 at the first metal layer on the first-level via 31, and a second-level via 41.

Similarly, the second word line 1083 is a metal line in the second metal layer. The second word line 1083 is routed at the same direction as the first landing pad 1081. The second word line 1083 connects to the landing pad 1081 by a second-level via 41. Therefore the gate of the second pass gate PG_2 is connected to the second word line 1083 by a second contact group 1080, comprising the gate contact WL_B on the gate of PG_2, a first-level via 31 on the gate contact WL_B, a landing pad 1081 at the first metal layer on the first-level via 31, and a second-level via 41.

As illustrated in FIGS. 3(j) and 3(k), the first contact group 1060 under the first word line 1063 and the second contact group 1080 under the second word line 1083 are diagonally opposite to each other forming a zigzag style. The first line 10681 is the direction the first word line 1063 and the second word line 1083 are routed, which is the same direction as the bit line direction. The second line 10683 is the line going through a center of the first contact group 1060 and the second contact group 1080. There is an angle 10685 between the first line 10681 and the second line 10683. The angle 10685 is within a range from about 15 degree to about 75 degree.

A device comprises a data latch storage unit with a first inverter having a first output, and a second inverter having a second output which is a complement of the first output. The device further comprises a first dummy circuit connected to the first output, and a second dummy circuit connected to the second output.

A layout device comprises a first pull-down transistor, a first pull-up transistor, a second pull-down transistor, and a second pull-up transistor. The layout device further comprises a first partial dummy transistor, a second partial dummy transistor, a third partial dummy transistor, and a fourth partial dummy transistor. A first active area acts as a drain of the first pull-down transistor and a dummy drain of the fourth partial dummy transistor. A second active area acts as a drain of the first pull-up transistor and a dummy drain of the third partial dummy transistor. A third active area acts as a drain of the second pull-down transistor and a dummy drain of the first partial dummy transistor. A fourth active area acts as a drain of the second pull-up transistor and a dummy drain of the second partial dummy transistor. A ground signal connected to a source of the first pull-down transistor and a source of the second pull-down transistor. A voltage supply signal Vdd connected to a source of the first pull-up transistor and a source of the second pull-up transistor.

A layout device comprises a first gate electrode, a second gate electrode, a ground signal, a voltage supply signal Vdd, a first active area, a second active, a third active area, and a fourth active area, in addition to a first long contact and a second long contact. The first active area comprises a source of a first pull-down transistor at a first side of the first gate electrode, a drain of the first pull-down transistor at a second side of the first gate electrode, and a dummy drain for a fourth partial dummy transistor at a first side of a second gate electrode. The second active area comprises a source of a first pull-up transistor at the first side of the first gate electrode, a drain of the first pull-up transistor at the second side of the first gate electrode, and a dummy drain for a third partial dummy transistor at the first side of the second gate electrode. The third active area comprises a source of a second pull-down transistor at a second side of the second gate electrode, a drain of the second pull-down transistor at the first side of the second gate electrode, and a dummy drain for a first partial dummy transistor at the second side of the first gate electrode. The fourth active area comprises a source of a second pull-up transistor at the second side of the second gate electrode, a drain of the second pull-up transistor at the first side of the second gate electrode, and a dummy drain for a second partial dummy transistor at the second side of the first gate electrode. The first long contact is connected to the first gate electrode by a first butt-contact, the drain of the second pull-up transistor, the drain of the second pull-down transistor, the drain of the first partial dummy transistor, and the drain of the second partial dummy transistor. The second long contact is connected to the second gate electrode by a second butt-contact, the drain of the first pull-up transistor, the drain of the first pull-down transistor, the drain of the third partial dummy transistor, and the drain of the fourth partial dummy transistor. The ground signal connected to the source of the first pull-down transistor and the source of the second pull-down transistor. The voltage supply signal Vdd connected to the source of the first pull-up transistor and the source of the second pull-up transistor.

Although the present disclosure and its advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure of the present disclosure processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A device comprising:
   a data latch storage unit comprising a first terminal and a second terminal;
   a first dummy circuit coupled to the first terminal of the data latch storage unit, the first dummy circuit comprising a first partial dummy transistor and a second partial dummy transistor, wherein the first partial dummy transistor is formed in a first active area of a substrate and the second partial dummy transistor is formed in a second active area of the substrate; and
   a first gate electrode extending over an edge of the first active area and over an edge of the second active area, wherein the edges of the first active area and the second active area are disposed within a width of the first gate electrode.

2. The device of claim 1, further comprising:
   a second dummy circuit coupled to the second terminal of the data latch storage unit, the second dummy circuit comprising a third partial dummy transistor and a fourth partial dummy transistor, wherein the third partial dummy transistor is formed in a third active area of the substrate and the fourth partial dummy transistor is formed in a fourth active area of the substrate; and a second gate electrode extending over an edge of the third active area and over an edge of the fourth active area, wherein the edges of the third active area and the fourth active area are disposed within a width of the second gate electrode.

3. The device of claim 2, wherein the first gate electrode and the second gate electrode are routed in parallel.

4. The device of claim 2, wherein the first partial dummy transistor has a floating first dummy source, the second partial dummy transistor has a floating second dummy source, the third partial dummy transistor has a floating third dummy source, and the fourth partial dummy transistor has a floating fourth dummy source.

5. The device of claim 2, wherein the first gate electrode further extends over a portion of the third active area and over a portion of the fourth active area, the first gate electrode disposed in a region between a source and a drain of a second pull-up transistor formed in the third active area, and in a region between a source and a drain of a second pull-down transistor formed in the fourth active area.

6. The device of claim 2, wherein the second gate electrode further extends over a portion of the first active area and over a portion of the second active area, the second gate electrode disposed in a region between a source and a drain of a first pull-down transistor formed in the first active region, and in a region between a source and a drain of a first pull-up transistor formed in the second active region.

7. The device of claim 1, wherein the data latch storage unit comprises:
a first pull-down transistor formed in the first active area, wherein a dummy drain of the first partial dummy transistor is proximal the first gate electrode, and wherein a source and a drain of the first pull-down transistor are distal the first gate electrode; and
a first pull-up transistor formed in the second active area, wherein a dummy drain of the second partial dummy transistor is proximal the first gate electrode, and wherein a source and a drain of the first pull-up transistor are distal the first gate electrode.

8. The device of claim 1, wherein the first active area and the second active area are laterally separated from each other.

9. The device of claim 1, wherein a width of the first active area is greater than a width of the second active area.

10. A layout device comprising:
a first pull-down transistor and a fourth partial dummy transistor formed in a first active area, wherein the first active area acts as a drain of the first pull-down transistor and a dummy drain of the fourth partial dummy, and wherein no portion of an edge of the first active area extends outside a width of a first gate electrode;
a first pull-up transistor and a third partial dummy transistor formed in a second active area, wherein the second active area acts as a drain of the first pull-up transistor and a dummy drain of the third partial dummy transistor, and wherein no portion of an edge of the second active area extends outside the width of the first gate electrode;
a second pull-down transistor and a first partial dummy transistor formed in a third active area, wherein the third active area acts as a drain of the second pull-down transistor and a dummy drain of the first partial dummy transistor, and wherein no portion of an edge of the third active area extends outside a width of a second gate electrode extending parallel to the first gate electrode; and a second pull-up transistor and a second partial dummy transistor formed in a fourth active area, wherein the fourth active area acts as a drain of the second pull-up transistor and a dummy drain of the second partial dummy transistor, and wherein no portion of an edge of the fourth active area extends outside the width of the second gate electrode.

11. The layout device of claim 10, further comprising:
a ground signal connected to a source of the first pull-down transistor and a source of the second pull-down transistor; and
a voltage supply signal connected to a source of the first pull-up transistor and a source of the second pull-up transistor.

12. The layout device of claim 10, wherein the first gate electrode acts as a gate for the first pull-down transistor, a gate for the first pull-up transistor, a dummy gate for the first partial dummy transistor, and a dummy gate for the second partial dummy transistor, and wherein the second gate electrode acts as a gate for the second pull-down transistor, a gate for the second pull-up transistor, a dummy gate for the third partial dummy transistor, and a dummy gate for the fourth partial dummy transistor.

13. The layout device of claim 10, wherein the first pull-down transistor and the second pull-down transistor are FinFET transistors, each FinFET transistor comprising a plurality of fins.

14. The layout device of claim 10, further comprising:
a first long contact connected to the first gate electrode by a first butt-contact, the first long contact further connected to the drain of the second pull-up transistor, the drain of the second pull-down transistor, the dummy drain of the first partial dummy transistor, and the dummy drain of the second partial dummy transistor.

15. The layout device of claim 14, further comprising:
a second long contact connected to the second gate electrode by a second butt-contact, the second long contact further connected to the drain of the first pull-up transistor, the drain of the first pull-down transistor, the dummy drain of the third partial dummy transistor, and the dummy drain of the fourth partial dummy transistor.

16. The layout device of claim 15, further comprising:
a first pass gate transistor and a second pass gate transistor, wherein the first pass gate transistor and the second pass gate transistor share a common drain area connected to the first long contact, a source of the first pass gate transistor is connected to a first bit line, a gate of the first pass gate transistor is connected to a first word line, a source of the second pass gate transistor is connected to a second bit line, a gate of the second pass gate transistor is connected to a second word line; and
a third pass gate transistor and a fourth pass gate transistor, wherein the third pass gate transistor and the fourth pass gate transistor share a common drain area connected to the second long contact, a source of the third pass gate transistor is connected to a first complement bit line, a gate of the third pass gate transistor is connected to the first word line, a source of the fourth pass gate transistor is connected to a second complement bit line, and a gate of the fourth pass gate transistor connected to the second word line.

17. The layout device of claim 16, further comprising:
a first shielding line separating the first bit line and the second bit line; and
a second shielding line separating the first complement bit line and the second complement bit line, wherein the first shielding line and the second shielding line are electrically connected to a constant voltage.

18. A layout device, comprising:

a first active area comprising a source of a first pull-down transistor at a first side of a first gate electrode, a drain of the first pull-down transistor at a second side of the first gate electrode, and a dummy drain for a fourth partial dummy transistor at a first side of a second gate electrode;

a second active area comprising a source of a first pull-up transistor at the first side of the first gate electrode, a drain of the first pull-up transistor at the second side of the first gate electrode, and a dummy drain for a third partial dummy transistor at the first side of the second gate electrode;

a third active area comprising a source of a second pull-down transistor at a second side of the second gate electrode, a drain of the second pull-down transistor at the first side of the second gate electrode, and a dummy drain for a first partial dummy transistor at the second side of the first gate electrode; and a fourth active area comprising a source of a second pull-up transistor at the second side of the second gate electrode, a drain of the second pull-up transistor at the first side of the second gate electrode, and a dummy drain for a second partial dummy transistor at the second side of the first gate electrode, wherein no portion of the first active area or the second active area extends beyond a width of the second gate electrode, and wherein no portion of the third active area or the fourth active area extends beyond a width of the first gate electrode.

19. The layout device of claim 18, further comprising:

a first long contact connected to the first gate electrode by a first butt-contact, the drain of the second pull-up transistor, the drain of the second pull-down transistor, the drain of the first partial dummy transistor, and the drain of the second partial dummy transistor; and a second long contact connected to the second gate electrode by a second butt-contact, the drain of the first pull-up transistor, the drain of the first pull-down transistor, the drain of the third partial dummy transistor, and the drain of the fourth partial dummy transistor.

20. The layout device of claim 18, further comprising:

a ground signal connected to the source of the first pull-down transistor and the source of the second pull-down transistor; and a voltage supply signal connected to the source of the first pull-up transistor and the source of the second pull-up transistor.

* * * * *